United States Patent [19]

White et al.

[11] Patent Number: 4,741,926

[45] Date of Patent: May 3, 1988

[54] SPIN-COATING PROCEDURE

[75] Inventors: Lawrence K. White, W. Windsor Township, Mercer County; Nancy A. Miszkowski, Lawrence Township, Mercer County, both of N.J.

[73] Assignee: RCA Corporation, Princeton, N.J.

[21] Appl. No.: 792,535

[22] Filed: Oct. 29, 1985

[51] Int. Cl.$^4$ .............................................. B05D 3/12
[52] U.S. Cl. ................................. 427/240; 427/345.5; 437/231
[58] Field of Search ...................... 427/240, 385.5, 825; 437/231

[56] References Cited

U.S. PATENT DOCUMENTS

| | | | |
|---|---|---|---|
| 3,795,534 | 3/1974 | Mehalso et al. | 117/101 |
| 4,280,689 | 7/1981 | Frosch | 427/240 |
| 4,281,057 | 7/1981 | Castellani et al. | 430/270 |
| 4,385,083 | 5/1983 | Shelley | 427/240 |
| 4,451,507 | 5/1984 | Beltz et al. | 427/240 |
| 4,510,176 | 4/1985 | Cuthbert et al. | 427/240 |

FOREIGN PATENT DOCUMENTS 0050573  3/1982  Japan .................................. 427/240

OTHER PUBLICATIONS

Chivers, Preprints of Kodak Microelectronics Seminar, Interface '84, pp. 44–51.
White, SPIE vol. 539, Advances in Resist Technology and Processing II, pp. 29–35, 1985.
White et al., J. Vac. Sci. Technol. B, vol. 3, No. 3, pp. 862–868, 1985.

*Primary Examiner*—Janyce A. Bell
*Attorney, Agent, or Firm*—S. C. Corwin; B. E. Morris

[57] ABSTRACT

Nonuniform topographical features on a substrate are effectively coated for lithographic processing by spin-coating with a suitable resin material in a dual spin cycle. The coating material is initially spin-coated onto the substrate at not less than 4000 rpm, preferably from 6000 to 8000 rpm, until build-up of the coating is detectable on a side wall of a topographical feature facing the centrifugal center of the spinning substrate. The spin speed is immediately reduced to less than 4000 rpm, preferably from about 1000 to 3500 rpm, and spinning is continued for a time sufficient to dry the coating. The subject process is particularly suitable for coating a substrate having nonuniform topographical features with a planarizing material.

6 Claims, No Drawings

SPIN-COATING PROCEDURE

This invention relates to an improved procedure for producing a uniform coating of a spun-on resist or polymer solution over surface topography.

BACKGROUND OF THE INVENTION

The use of certain polymers as resists for lithographic processing of semiconductor substrates is well known. Frequently, the substrate has topographical features which cause a resist coating to be uneven. In order to produce lithographic patterns finer than one micrometer, it is required that a resist pattern layer be smooth and have minimal thickness variations. To achieve this, it is conventional to initially coat the substrate with a spun-on coating of a polymer which planarizes topographical features and apply the resist layer thereover.

The use of multilayer resist systems comprising at least a planarizing layer and a resist layer has not totally solved the problem of how to effectively planarize substrate topographical features, particularly features which are nonuniformly oriented with respect to the centrifugal center of the substrate. It has been demonstrated, for example, that spin-coating, which is the conventionally used technique of coating a substrate with a resist preparation, will produce radial flow anomalies when the resist is applied to a substrate having nonuniform topographical features.

Radial flow anomalies on a substrate having nonuniform topographical features will change merely by varying the orientation of the features with respect to the centrifugal center of the wafer being spin-coated without varying the size or the configuration of the features themselves. These anomalies cause a bulid-up of coating material on the side of the topographical features adjacent to the centrifugal center, increased step heights in the coating and asymmetric coating contours. These effects become more pronounced as the distance from the centrifugal center of the wafer increases. It has further been demonstrated that changing the position or the size of a single topographical feature can affect the thickness of the coating on adjacent features, particularly those situated outwardly from the altered feature on a line extending from the centrifugal center. It will be appreciated that the problems associated with planarizing the surface of a semiconductor substrate having nonuniform topographical features become more complex as design dimensions shrink and circuitry is built vertically from the wafer surface. A means of improving the spin-coating of a solution of an organic material onto a substrate having topographical features is provided in accordance with this invention.

SUMMARY OF THE INVENTION

A solution of an organic material, suitably a resist material, is coated onto a substrate having nonuniform topographical features by spin-coating in two stages, the initial and faster of which lasts only until there is a detectable build-up of coating material on the side of topographical features facing the centrifugal center of the spinning substrate.

DETAILED DESCRIPTION OF THE INVENTION

The compositions applied to a substrate in accordance with the process of this invention can be any resin material which may be utilized to coat a substrate having topographical features. The subject process is suited to compositions possessing the capacity to planarize surface topography, as opposed to a conformal coating. Such compositions, which may or may not be resist compositions, are well known as is the technique of applying them by spin-coating. Although other resins, such as certain polyimides, can be utilized in the subject process, photoresist preparations are preferred because most possess planarizing capability, and they are available in ultrapure form. Examples of such preparations include poly(methylmethacrylate) and novolac resin/diazoquinone sensitizer photoresist compositions.

In general, the commercial novolac photoresist preparations are comprised of a phenol formaldehyde or cresol formaldehyde resin and a benzoquinone or naphthaquinone derivative sensitizer therefor. The solvent in such preparations is an organic solvent such as, for example, propylene glycol methyl ether acetate, available from Dow Corporation under the Trademark Dowanol PMA, ethylene glycol ethyl ether acetate, butyl acetate, cyclohexanone and the like. The amount of resin or solvent in a given preparation is not particularly critical to the invention so long as the preparation can be coated onto a substrate by spin-coating. For example, OFPR 800, having a viscosity of 30 centipoise, a positive photoresist containing 27 percent solids available from Dynachem Corp. and PMMA, molecular weight 496,000, having a viscosity of 90 centistokes with 9 percent solids, available from KTI chemicals, Inc. both provide an acceptable coating in accordance with this invention.

The substrates to be coated in accordance with this invention may be any suitable material, for example, single crystal silicon, gallium arsenide, metallic silicides, polycrystalline materials with suitable surfaces, vitreous materials and the like. Topographical features on the substrate surface may be of the same or a different material. Generally, most topographical features will have a step height of 0.5 to 1.0 micrometer and may have any configuration or orientation.

In order to effectively coat or planarize such nonuniform topographical features, the coatings formed in accordance with the subject process are from about one to about two and one half, preferably about two, micrometers in thickness.

As stated previously, the process of this invention is most advantageous in spin-coating a planarizing composition onto a substrate having topographical features which are nonuniform in orientation with respect to the centrifugal center of the substrate. The subject process is equally effective regardless of whether the coating composition is dispensed onto the substrate by conventional static or dynamic dispenser apparatus. Topographical features are coated in accordance with the subject process in two stages. In the first stage, the coating material is dispersed onto the surface substrate and spun at not less than about 4000 rpm, preferably from about 6000 rpm to about 8000 rpm, until build-up of coating is detectable on a side wall of a topographical feature. It will be appreciated that such build up will occur on the side wall most adjacent to and facing the centrifugal center of the spinning substrate. Typically, the first high speed spin stage will require from about 2 to about 8, preferably from about 2 to about 4 seconds, depending on the characteristics of both the coating material and the substrate topographical features and, to a lesser extent, in the size of the substrate. For example, experience has shown that the high speed spin stage must be continued somewhat longer as the size of the substrate increases.

It is contemplated that the initial build-up of coating material will be detectable with an instrument such as a profilometer. However, any comparable means of detecting a build-up of the coating material may be utilized. Experience has demonstrated that the initial detectable build-up is not materially deleterious to the overall planarizing of surface topography if the spin speed is immediately lowered to the second state. For example, it has been demonstrated that a particular commercial resist preparation spun onto a substrate at about 5000 rpm will produce a detectable build-up at about 4 seconds. The build-up will not reach an unacceptable level at that speed, however, until about 8 seconds has elapsed.

When the first stage of the subject process has produced a detectable build-up of coating material on a side wall of substrate topography, the speed of the coating is immediately reduced to less than about 4000 rpm, suitably from about 1000 to 3500 rpm. The substrate is rotated for an additional period sufficient to dry the coating, suitably at least about 10 seconds and preferably at least about 20 seconds. A typical spin-coating cycle for a substrate three inches in diameter utilizing the subject process comprises: dispensing the coating material onto the substrate; spinning for about two seconds at about 6000 rpm utilizing apparatus capable of 10,000/second rpm acceleration/deacceleration; reducing the spin speed to about 2000 rpm and continuing to spin the substrate for an additional 28 seconds. Experience has shown that the coating remains essentially unchanged after about 30 seconds of total spin time at the speeds contemplated herein.

The two-stage spin-coating process of this invention has been shown to produce minimal radial flow-induced coating anomalies with excellent thickness uniformity, conformity and reproducibility. In contrast, a short spin cycle at high speed, i.e. four seconds at 6000 rpm, which has been proposed by Chivers, Preprints of Kodak Microelectronics Seminar, Interface '84, pages 44–51, produces a thicker, solvent-laden coating which is comparatively unstable and difficult to control. Utilizing the same coating composition, it has been shown that, on the average, a coating produced by the subject process is between about ten and twenty percent thinner than one produced by a short spin cycle. More important, because of the solvent content, the coating produced by the short spin cycle is sensitive to environmental changes. Solvent continues to evaporate from a coating produced by a short spin cycle for from a few up to ten seconds or longer. This has a significant adverse effect on the stability of the coating and, therefore, on the reproducibility of results. The fact that the short spin cycle can produce a more substantial reduction in radial flow-induced surface anomalies than the subject process is more than offset by these disadvantages.

In contrast, the two-stage spin-coating process of this invention has been demonstrated to produce a stable, controllable coating with excellent reproducibility. In addition, alignment accuracy measurements on spin-coated automatic alignment keys showed that the reductions in radial flow-induced coating anomalies resulting from the subject process produced improvement in alignment accuracies which, in turn, enhances the efficiency of automatic alignment equipment, a distinct advantage.

The following Examples further illustrate this invention, it being understood that the invention is in no way intended to be limited to the details described therein. In the examples, all parts and percentages are on a weight basis and all temperatures are in degrees Celsius, unless otherwise stated.

EXAMPLE 1

Various spin-coating procedures were compared utilizing as substrates three inch single crystal silicon wafers having a patterned layer of silicon dioxide on the surface producing nonuniform topographical features. The topographical features of silicon dioxide were either 0.5 or 1.0 micrometer in height. The features were randomly situated isolated line features 500 micrometers in length and from 40 to 2 micrometers in width which were oriented parallel to and perpendicular to the radial flow of material from the centrifugal center of the wafer.

A static dispense was utilized for spin-coating all wafers with an acceleration/deacceleration rate of about 10,000 rpm per second. The wafers were coated with OFPR 800 positive resist at the following spin speeds: 4000 rpm for 30 seconds; 6000 rpm for 4 seconds; and 6000 rpm for 2 seconds, followed by 2000 rpm for 28 seconds. The coatings were measured using a Tencor Profilometer operating at a 15 milligram tracking force on a 10 KA scale. The accuracy of the measurements was on the order of plus or minus 10 nm.

On the long spin at 4000 rpm, the perpendicular oriented lines showed increased step height and the beginning of radial flow-induced anomalies after 4 seconds. After 8 seconds, the step height of the perpendicular lines showed a further increase relative to the parallel lines. By 15 seconds, both had increased substantially and the magnitude of the increase for the perpendicular lines was substantially greater than that for the parallel lines. Little further change could be observed after 30 seconds.

On both the dual spin and short spin cycles, no anomalies were observed up to 4 seconds. However, the short spin coating retained a detectable amount of the coating solvent and showed greater deviations in coating thickness uniformity than the dual spin cycle. In the dual spin cycle, the coating was free of solvent at the end of the 30 second spin time and sidewall coating buildup was shown by profilometric analysis to be substantially less than that produced by the long spin coating, based on an average of three wafers.

EXAMPLE 2

The substrates utilized to compare alignment accuracy of the spin coating cycles of Example 1 were three inch single crystal silicon wafers having a randomly situated p atterned layer of silicon dioxide on the surface. The pattern was the alignment key chevrons used for the Optimetrix 8010 stepper. These keys were 0.5 micrometer in height and configured as elevated islands. The entire surface was coated by conventional evaporation with 0.2 micrometer of a highly reflective layer of tantalum disilicide.

Wafers were coated with OFPR 800 positive resist at 4000 rpm for 30 seconds; 6000 rpm for 30 seconds; 6000 rpm for 4 seconds; and 6000 rpm for 2 seconds, followed by 2000 rpm for 28 seconds. Experience has shown that radial flow anomalies cause the position of the alignment keys to become distorted.

The results for both the long spin at 4000 rpm and that at 6000 rpm were about equal and clearly inferior to the other two coating procedures. The short cycle and the dual spin cycle produced experimentally equivalent alignments.

EXAMPLE 3

Test wafers were coated in accordance with the procedure of Example 1 utilizing the short spin cycle, i.e. 6000 rpm for 2 seconds, and the subject dual spin cycle, i.e. 6000 rmp for 2 seconds followed by 2000 rpm for 28 seconds. One wafer was coated daily by each procedure for 20 days.

The thickness variations of the coatings were determined for each group of wafers. The variation in the thickness of the coating from center to edge for a given wafer on a daily basis was typically about 300 angstroms for the short spin cycle and about 100 angstroms for the dual spin cycle.

The short spin cycle demonstrated a variation in coating thickness among the wafers over the twenty day period of 1400 angstroms, i.e. the difference between the thinnest and the thickest measurements was 1400 angstroms. In comparison the subject dual spin cycle demonstrated a variation in coating thickness of only 150 angstroms. The thickness measurements compared in this instance were taken at the center of the wafer. The advantage of the subject process is clearly demonstrated by these results.

What is claimed is:

1. In a process of coating a substrate having nonuniform topographical features comprising dispensing a composition comprising a suitable resin and a solvent onto the substrate thus forming a coating and spinning the substrate to dry the coating, the improvement wherein the substrate is spun to dry the coating in two stages consisting of initially spinning at not less than about 4000 rpm until a detectable build-up of the coating material occurs on a side wall of a topographical feature facing the centrifugal center of the spinning substrate and thereafter spinning the substrate at less than about 4000 rpm for a period of time sufficient to dry the coating.

2. A process in accordance with claim 1, wherein the substrate is initially spun at from about 6000 rpm to about 8000 rpm.

3. A process in accordance with claim 1, wherein the substrate is initially spun for from about 2 to about 8 seconds.

4. A process in accordance with claim 1, wherein the speed of the substrate is reduced to from about 1000 to about 3500 rpm.

5. A process in accordance with claim 1, wherein the total time of both spin coating steps is about 30 seconds.

6. A process in accordance with claim 5, wherein the substrate is initially spun at about 6000 rpm for from about 2 to about 4 seconds and then spun at about 2000 rpm.

* * * * *